June 13, 1967 J. B. CHAMPLIN ETAL 3,324,974
PRINTED CIRCUIT CARD DAMPER
Filed July 12, 1965

INVENTORS
JAMES B. CHAMPLIN
RICHARD P. STEIN
BY
Marvin Moody
ATTORNEY

United States Patent Office 3,324,974
Patented June 13, 1967

3,324,974

PRINTED CIRCUIT CARD DAMPER

James B. Champlin, Richardson, and Richard P. Stein, Garland, Tex., assignors to Collins Radio Company, Cedar Rapids, Iowa, a corporation of Iowa Filed July 12, 1965, Ser. No. 470,996
6 Claims. (Cl. 188—1)

ABSTRACT OF THE DISCLOSURE

This invention relates to an apparatus for preventing excessive vibrations from occurring on a printed circuit card or the like. The invention consists of a circuit card damper of visco-elastic damping material which is attached to a surface of the card to minimize vibrations. The damping material is in the form of a right angle cross and prevents the card from resonating when subjected to vibrations. The damper can also include a metallic shim having the same configuration as the damper encapsulated near the outer surface of the damper.

This invention relates in general to damping means and in particular to a mechanical damping means of visco-elastic material.

In electronics, printed circuit boards are being used more and more. Such boards are often mounted in fabricated card cages wherein a plurality of circuit boards are mounted in mounting slots in a parallel-spaced relationship. Oftentimes the completed equipment is mounted in vehicles and are subject to vibrations. This tends to cause the cards to vibrate in their slots and can cause excessive accelerations due to the response of the plastic material of the circuit boards which can cause crystals, relays and component leads to fatigue and fail. As a specific example, when a plus or minus one *g* sinusoidal vibration is applied to a card cage, components on the board may see from ±20 to ±40 *g*'s due to the resonant response of the springy board material. Under these conditions, the leads and various components can fail.

The present invention relates to a method and apparatus for preventing excessive vibrations occurring on a card and consists of the application of a circuit card damper of visco-elastic damping material which is attached to a surface of the card to minimize vibrations.

It is an object of the present invention to provide a damper for a printed circuit card or other plate.

Another object of this invention is to eliminate undesirable vibrations in a printed circuit board.

A feature of this invention is found in the provision for a damper of visco-elastic material on the surface of a printed circuit board to eliminate undesirable vibrations in the board.

Further objects, features and advantages of this invention will become apparent from the following description and claims when read in view of the accompanying drawings, in which:

Figure 1:
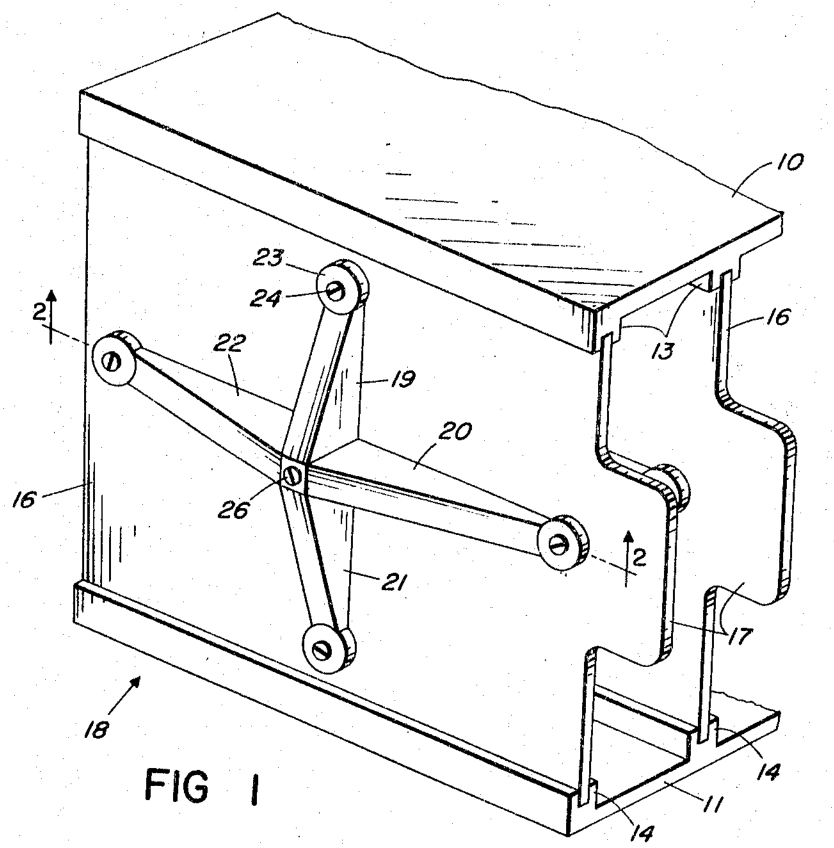
FIGURE 1 illustrates a printed circuit board of this invention mounted in a card cage.

Excessive acceleration on circuit board components can be reduced in several ways:

(1) Place the circuit board in a rigid box which is mounted on damped vibration isolators, the resonant frequency of which is well below that of the circuit board.

(2) Place the circuit boards in damped, isolated slides.

(3) Place the circuit cards in a rigid box in tight-fitting slides and place vibration dampers on the circuit boards.

Method 1 would work if enough sway space were available for the entire box. Assuming a card resonance of 80 c.p.s. and an isolator resonance of 20 c.p.s. with a transmissibility of 5, with 2 *g*'s input at 20 c.p.s., the box will see 10 *g*'s. The sway space needed will be ±.25 inch.

Method 2 would work under the same conditions of Method 1. From this, it can be seen that input/output cabling would need large service loops, special rigidized termination and clamps to prevent fatiguing of leads or failure of connectors if Method 1 or 2 were used.

Using Method 3 eliminates the need for special mounting means for the boxes or card cages, and special treatment of cabling and connectors. The main disadvantage of Method 3 is that any space used for a damper will reduce the space for components and circuitry.

Assuming the board space is available for a damper, the only problems remaining are the dynamic damping characteristics and the geometry of the damper to be used.

The first problem was to develop an elastomeric plastic which has sufficient hysteresis to damp a circuit board so that the maximum transmissibility will be 5:1.

Many commercially available plastics were studied including those specifically developed for vibration damping. The following chart gives results of this study.

TABLE I

| Material | Temperature | Transmissibility | Remarks |
|---|---|---|---|
| Butyl Rubber | 0 to 130° F | 9 to 15 | |
| Silicon Rubber | 0 to 130° F | 12 to 18 | |
| Urethane Epoxy | −40 to 165° F | 6 to 8 | Requires only small area on board. |

The boards with dampers attached were tested in a fabricated sheet metal card cage with tight-fitting plastic card guides and a cast aluminum card cage with clearance guides. The tight-fitting plastic slides made the board look more like a simply supported beam.

From the tests it became evident that a flexible epoxy-urethane mixture would make the most efficient damper and after some experimentation, a mixture, by weight, of Hysol Corporation R9–2039 epoxy, R4–2085 urethane and H–2739 hardener in the following ratios was used: 21% epoxy, 57.9% urethane, 21.1% hardener.

A cross 5 x 7 x ⅜ wide, 7⁄16 thick was used and 8:1 transmissibilities were attained. It was later found that the thickness could be tapered to ⅛ inch at the ends of the cross without degrading the damping efficiency. Experimentation also showed that there was no change in transmissibility with the damper bonded to the board or just bolted to it at the center and four ends of the cross. It was also apparent that there was little to be gained by coating the entire board with the elastomer because at resonance the board moves in an "oil can" type mode. This means that the greatest movement is at the center of the board with little or no movement of the outside edge and corners. It was also shown that a cross worked as well as an "X"; therefore, the cross type of geometry was chosen because it used less area on the board.

To make the final reduction in transmissibility, a .005 thick perforated shim was cast into the top of the damper. This shim, by increasing the viscous shear, reduced the transmissibility from 8 to 5.

It should be noted that by reducing the amplification, the bandwidth was increased, meaning that for any sine-swept vibration input, components will be subjected to acceleration for a longer time on a damped board than on an undamped board. However, if the damped vibration level is below the fatigue limit of any of the components, no failure will be incurred.

During the testing phase, it was found that the transmissibility decreases with input. This is easily explained in that the higher the input at resonance, the greater the board movement which increases the viscous shear stresses in the damper. If the elastic stress is proportional to displacement, and the viscous shear stress is proportional to velocity, the transmissibility will decrease as the input resonant force is increased.

Typical values of transmissibility for varying inputs are shown below:

| Input, G | Transmissibility | Output at Center of Board, G | Resonant Freq., c.p.s. |
|---|---|---|---|
| 1 | 6 | 6 | 75 |
| 2 | 11 | 5.5 | 77 |
| 3 | 15 | 5.0 | 79 |
| 4 | 18 | 4.5 | 83 |

It should be noted that the above table merely lists typical values. These will vary depending upon board loading, temperature and position in the card cage. Tests also showed that the greater the concentration of mass of the center of the board, the lower the transmissibility. This is due to the fact that, in general, the more mass in the center of the board, the lower the resonant frequency. Lower resonance increases the displacement which, in turn, increases the viscous shear which is the force that actually does the damping.

The type of damper described in this report could well be used to damp units other than circuit boards such as the following:

A. Bolt on bars of damping material to eliminate chatter when machining thin sections.

B. Damping sheet metal sections to reduce the vibration input to other adjacent units.

C. Add to spring type isolators to act as dash pots.

D. Damping other structures such as parabolic type antennas.

For all of the above applications, the damper should be placed along the axes of maximum deflection.

During the past two decades, considerable research has been performed on visco-elastic damping materials, and on mechanical damping techniques. Materials normally used include the butyl, silicon and thiokol rubbers, and groups of modified polyesters. These materials either exhibit good temperature characteristics with an overall low damping coefficient, or have an excellent damping coefficient at a discrete temperature and deteriorate rapidly at elevated or depressed temperature ranges. Additionally, the cost of these materials is frequently prohibitive for general use.

The normal use of these materials is in visco-elastic layers laminated between a plurality of rigid structural panels to drastically increase shear stresses in the visco-elastic material in order to achieve a practical damping coefficient. This creates inherent fabrication costs and limitations, and damping effects are seriously reduced by the use of through bolts or rivets which prevent relative motion between laminated layers.

Other mechanical damping methods are also occasionally employed, such as riveted laminated joints and panels, dash pot arrangements and high-friction sliding members. Each of these methods is costly and difficult to apply.

The urethane-epoxy material overcomes the above deficiencies in that relatively high damping coefficients can be achieved within a single layer of material without the need for sandwiching between layers of rigid material. The material can be cast in sheets, plates or any other shape and attached to the structure requiring damping. The attachment may be accomplished merely by bolting or riveting, and does not need to be restrained by continuous bonding to artificially raise the internal stresses, since substantial damping is accomplished within the moderate stresses created by simple bending, tension or compression.

The history of this material itself begins a number of years ago when epoxy compounds began to achieve popular usage. One of the deficiencies in early materials was in its brittleness in dynamic and thermal stress applications. A series of epoxies evolved which overcame these limitations through the use of various "flexiblizers" added to the basic resins before curing. The amount of "flexiblizer" used controlled the final flexibility of the plastic. However, these compounds exhibit poor temperature characteristics, becoming brittle at the cold end, and very soft at elevated temperatures.

To solve this problem, the Hysol Corporation has developed suitable methods and catalysts for achieving copolymerization of epoxy resins with urethane elastomers to maintain flexibility as low as −85° C. Fortunately, these copolymers also exhibit visco-elastic tendencies as a by-product, and it was recognition of this property that led to this invention of visco-elastic dampers.

A distinct advantage of this damper is that this invention is strictly an "add-on" member. It can be attached to existing printed card assemblies and merely bolted in place over circuitry and component leads. Since the material is an excellent low-loss dielectric, no circuit degradation will occur from its use.

The damper can be added to existing cards as an afterthought and does not require special precaution during the design and construction stages of the printed card.

FIGURE 1 illustrates a chassis comprising main structural members 10 and 11 which are formed with a plurality of suitable card guides 13 and 14 into which printed circuit boards 16 may be mounted. The printed boards 16 are formed with handles 17 to facilitate their insertion and removal from the card cage thus formed. Components may be formed and attached to both or one side of the printed circuit board 16, but for simplicity are not shown. If the components are on only one side of the board, they would be mounted on the side opposite that to which the damper 18 of this invention is attached to the board. If the components are mounted on both sides of the board, the electrically insulating damper 18 would be attached over the components and circuits. The damper 18 consists of a cross-shaped member having four legs 19, 20, 21 and 22 which are tapered from their center junction to their ends. In each end an eyelet 23 is formed and an attaching bolt 24 extends therethrough to firmly attach the damper to the board. A fifth bolt 26 extends through an opening formed at the junction of the legs 19, 20, 21 and 22 to attach the center of the damper to the card.

Figure 2:
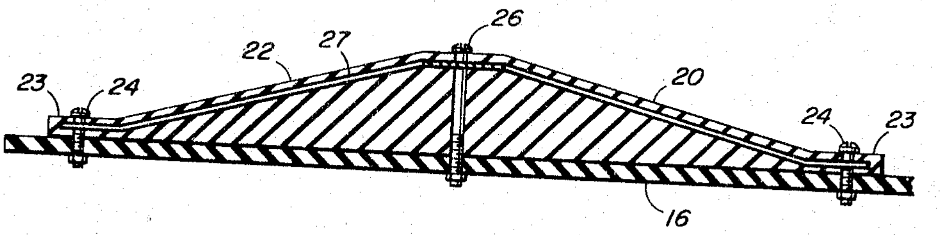
FIGURE 2 is a sectional view of the damper.

As best shown in FIGURE 2, it has been discovered that the addition of a shim member 27 formed of a metal having a high modulous of elasticity such as beryllium copper or brass and formed to follow the tapered configuration of the damping legs, may be encapsulated within the damping member to increase the damping efficiency of the device.

It is seen that this invention provides an improved damping device and although this invention has been described with respect to a particular embodiment thereof, it is not to be so limited, as changes and modifications may be made therein which are within the spirit and scope of the invention as defined by the appended claims.

We claim:

1. A damper for a plate comprising a cross-shaped member of visco-elastic material attached to one surface of the plate such that the entire surface of said cross-shaped member contacts said plate, and wherein said visco-elastic material consists of a urethane epoxy.

2. In apparatus according to claim 1 wherein the damper is tapered from the center cross point to the ends of the legs to decrease the thickness of the damper.

3. In apparatus according to claim 1, a metal shim member encapsulated within said cross-shaped member and having a cross-shaped configuration like that of said cross-shaped member said shim and said cross-shaped member being of substantially equal size.

4. In apparatus according to claim 2, a metal shim member encapsulated within said cross-shaped member and having a cross-shaped configuration like that of said cross-shaped member, said shim member being shaped to follow the taper of said legs from the center cross point to the leg ends.

5. In apparatus according to claim 1, wherein said visco-elastic material is comprised of a mixture of epoxy, urethane and hardener in the respective ratios of 21 percent, 57.9 percent and 21.1 percent.

6. A cross-shaped damping media placed in physical contact with a member in which vibration is to be minimized, said damping media comprising a visco-elastic material formed as a mixture of 21 percent epoxy, 57.9 percent urethane and 21.1 percent hardener.

References Cited

UNITED STATES PATENTS

| | | | |
|---|---|---|---|
| 3,078,971 | 2/1963 | Wallerstein | 188—1 X |
| 3,160,549 | 12/1964 | Caldwell et al. | |
| 3,169,881 | 2/1965 | Bodine | 188—1 |
| 3,262,521 | 7/1966 | Warnaka | 188—1 |
| 3,273,670 | 9/1966 | Kleinlein | 188—1 |

DUANE A. REGER, *Primary Examiner.*